United States Patent
Park et al.

(10) Patent No.: US 6,720,275 B2
(45) Date of Patent: Apr. 13, 2004

(54) METHODS OF FABRICATING CAPACITORS INCLUDING TA$_2$O$_5$ LAYERS IN A CHAMBER INCLUDING CHANGING A TA$_2$O$_5$ LAYER TO HEATER SEPARATION OR CHAMBER PRESSURE

(75) Inventors: Ki-yeon Park, Seoul (KR); Heung-soo Park, Seoul (KR); Young-wook Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/387,091

(22) Filed: Mar. 12, 2003

(65) Prior Publication Data

US 2003/0166346 A1 Sep. 4, 2003

Related U.S. Application Data

(62) Division of application No. 09/867,109, filed on May 29, 2001, now Pat. No. 6,555,394, which is a continuation-in-part of application No. 09/209,196, filed on Dec. 10, 1998, now Pat. No. 6,426,308, which is a division of application No. 08/707,904, filed on Sep. 12, 1996, now Pat. No. 5,910,218.

(30) Foreign Application Priority Data

Nov. 29, 1995 (KR) ............................................. 95-44270
May 30, 2000 (KR) ......................................... 2000-29303

(51) Int. Cl.$^7$ .......................................... H01L 21/469
(52) U.S. Cl. ............................. 438/785; 438/795; 438/3
(58) Field of Search ........................... 438/3, 240, 396, 438/397, 398, 253, 254, 255, 785, 783, 795, 799

(56) References Cited

U.S. PATENT DOCUMENTS

| | | | |
|---|---|---|---|
| 5,111,355 A | 5/1992 | Anand et al. ............... | 361/313 |
| 5,254,505 A | 10/1993 | Kamiyama .................. | 437/235 |
| 5,661,319 A | 8/1997 | Fujii et al. .................. | 257/295 |
| 5,688,724 A | 11/1997 | Yoon et al. ................. | 437/235 |
| 5,766,360 A | 6/1998 | Sato et al. .................. | 118/666 |
| 5,769,588 A | 6/1998 | Toshima et al. ............ | 414/217 |
| 5,769,952 A | 6/1998 | Komino ...................... | 118/773 |
| 5,910,218 A | 6/1999 | Park et al. .................. | 118/719 |
| 6,096,597 A | 8/2000 | Tsu et al. | |
| 6,218,260 B1 | 4/2001 | Lee et al. ................... | 438/398 |
| 6,232,248 B1 * | 5/2001 | Shinriki et al. ............. | 438/785 |
| 6,416,584 B1 | 7/2002 | Won et al. | |
| 6,617,266 B2 * | 9/2003 | Nickles et al. .............. | 438/785 |

OTHER PUBLICATIONS

Hiroshi Shinriki et al., *UV–O$_3$ and Dry–O$_2$: Two–Step Annealed Chamical Vapor–Deposited TA$_2$O$_5$ Films for Storage Dielectrics of 64Mb DRAM's*, IEEE Transactions On Electron Devices, vol. 38, No. 3, pp. 455–462 (Mar. 1991).

Shinriki et al., *UV–Ozone And Dry–Oxygen: Two–Step Annealed Chemical Vapor–Deposited Tantalum Pentoxide Films For Storage Dielectrics Of 64–Mb DRAM's*, (ABSTRACT), IEEE Trans. Electron Devices, vol. 38, No. 3, pp. 455–462 (1991).

(List continued on next page.)

*Primary Examiner*—Tuan H. Nguyen
(74) *Attorney, Agent, or Firm*—Myers Bigel Sibley & Sajovec, P.A.

(57) ABSTRACT

Methods of forming Ta$_2$O$_5$ layers in a process chamber are disclosed. A Ta$_2$O$_5$ layer can be maintained at a first temperature that is less than a temperature for crystallization of the Ta$_2$O$_5$ layer. At least one of a position of the Ta$_2$O$_5$ layer in the process chamber relative to the heater and a pressure in the process chamber is changed to increase the temperature of the Ta$_2$O$_5$ layer to about the temperature for crystallization.

10 Claims, 9 Drawing Sheets

OTHER PUBLICATIONS

Ohji et al., *Improvement In Stoichiometric Composition Of CVD–Ta2O5 Capacitor Dielectric Films For DRAM*, (ABSTRACT), Proc.–Electrochem. Soc. (1993), 93–25 (Interconnects, Contact Metallization, and Multilevel Metallization/Reliability for Semiconductor Devices, Interconnects, and Thin Insulator Materials), pp. 400–409.

Maeda, *Ozone Applied In Semiconductor Industry*, (ABSTRACT), VLSI, Kurin Tekunoroji, 5, pp. 45–49 (1995).

Fujino et al., *Low–Temperature Atmospheric–Pressure Chemical Vapor Deposition Using 2,4,6,8–tetramethylcyclotetrasiloxane And Ozone*, (ABSTRACT), Japanese Journal of Applied Physics, Part 1: Regular Papers & Short Notes & Review Papers, vol. 33, No. 4A, pp. 2019–2024 (Apr. 1994).

Treichel et al., *Deposition, Annealing, And Characterization Of Tantalum Pentoxide Films*, (ABSTRACT), Proceedings of the 3$^{rd}$ Biennial Meeting of Chemical Perspectives of Microelectronic Materials, Mater. Res. Soc, vol. 282, pp. 557–568 (1993).

Ichinose et al., *Preparation and Rapid Thermal Annealing Effect of (Ba, Sr)TiO$_3$ Thin Films,* Jpn. J. Appl. Phys., vol. 34, Pt. 1, No. 9B, pp. 5198–5201 (1995).

CAPLUS 1991: 197622 (1991).

CAPLUS 1994: 258897 (1994).

CAPLUS 1995:513462 (1995).

INSPEC 1994: 4703350 (1994).

INSPEC 1994: 4687689 (1994).

* cited by examiner

METHODS OF FABRICATING CAPACITORS INCLUDING TA$_2$O$_5$ LAYERS IN A CHAMBER INCLUDING CHANGING A TA$_2$O$_5$ LAYER TO HEATER SEPARATION OR CHAMBER PRESSURE

CLAIM FOR PRIORITY

This application is a divisional of application Ser. No. 09/867,109, filed May 29, 2001 now U.S. Pat. No. 6,555,394, which is a Continuation-in-Part (CIP) of Ser. No. 09/209,196 issued U.S. Pat. No. 6,426,308, filed on Dec. 10, 1998, which is a divisional application of Ser. No. 08/707,904 issued U.S. Pat. No. 5,910,218 filed on Sep. 12, 1996, which claimed priority to Korean Patent Application No. 95-44270, filed on Nov. 29, 1995, the benefits of which are claimed by the present CIP. This application also claims priority to Korean Patent Application No. 00-29303, filed May 30, 2000. The disclosures of the above listed applications and patents are hereby incorporated herein by reference.

FIELD OF THE INVENTION

The present invention relates to the fabrication of integrated circuits in general, and more particularly, to methods of fabricating capacitors in integrated circuits.

BACKGROUND OF THE INVENTION

Ta$_2$O$_5$ layers having a high dielectric constant have been studied for use as a next generation dielectric in capacitors included in dynamic random access memories (DRAM) having a capacity of 1 Gigabit or more. It may be desirable for the Ta$_2$O$_5$ layers to have improved leakage current characteristics as well as improved heat resistance.

In general, Ta$_2$O$_5$ layers can be formed using thermal chemical vapor deposition (CVD) with Ta(OC$_2$H$_5$)$_5$ and O$_2$ as source gases. These source gases may introduce impurities, such as carbon (C) or water, in the Ta$_2$O$_5$ layer which may increase the leakage current of the Ta$_2$O$_5$ layer. Furthermore, the leakage current may be further increased if the Ta$_2$O$_5$ layer stays in an amorphous state after formation.

A conventional method of reducing the leakage current in a Ta$_2$O$_5$ layer and improving the properties of the layer can include the steps of forming the Ta$_2$O$_5$ layer; curing the Ta$_2$O$_5$ layer by supplementing a deficiency of oxygen in the Ta$_2$O$_5$ layer using a low temperature oxidation annealing process; and crystallizing the Ta$_2$O$_5$ layer by high temperature heating in an oxygen atmosphere and removing impurities in the Ta$_2$O$_5$ layer.

Curing a Ta$_2$O$_5$ layer by a low temperature oxidation annealing process can be performed using O$_3$ or UV-O$_3$. The curing mechanism can be as follows: O$_3$ is separated into O$_2$ and O (single oxygen atoms), using UV radiation. The separated single oxygen atoms can penetrate the Ta$_2$O$_5$ layer and attach to a dangling Ta bond site. In a high temperature UV-O$_3$ annealing process, the curing effect of the O$_3$ can be reduced while the curing due to thermal effects can be increased. Since the object of the low temperature oxidation annealing process using O$_3$ or UV-O$_3$ may be to improve the leakage current characteristics in a capacitor employing a Ta$_2$O$_5$ layer, it may be preferable for the process to be performed within an appropriate range of low temperatures.

It is known that the Ta$_2$O$_5$ layer can be crystallized by exposure to temperatures of about 720° C. Thus, it may be preferable that a high temperature heating process for crystallizing the Ta$_2$O$_5$ layer is performed at a temperature higher than 720° C.

When the annealing process using UV-O$_3$ is performed at a temperature higher than the crystallization temperature of a Ta$_2$O$_5$ layer, excess oxidation can occur between the Ta$_2$O$_5$ layer and a lower electrode, and electrostatic capacity of the layer may be reduced to one half or less of its original value. Thus, in order to suppress the excess oxidation and promote the curing effect of the O$_3$, the annealing process by UV-O$_3$ can be performed at a temperature that is lower than the crystallization temperature of the Ta$_2$O$_5$ layer, and the crystallization of the Ta$_2$O$_5$ layer can be performed at a temperature that is higher than or equal to the crystallization temperature of the Ta$_2$O$_5$ layer.

Conventional single wafer machines may use a resistance heater (the heater). Changing the temperature of the wafer using the heater may, however, take considerable time which could increase the fabrication time for the wafer. For example, in order to perform the low temperature oxidation annealing process and the high temperature heating process on the Ta$_2$O$_5$ layer using the same heater, the heater temperature is maintained at an appropriate temperature for the low temperature oxidation annealing process of the Ta$_2$O$_5$ layer, for example <500° C. Then, the heater temperature is increased to increase the temperature of the wafer to a temperature that is greater than or equal to the crystallization temperature (720° C.) to perform the high temperature heating process. The time needed to change the temperature of wafer from the low temperature oxidation process to the crystallization process temperature may take several tens of minutes.

It is known to perform the low temperature oxidation annealing process and the crystallization process using different wafer machines. For example, the low temperature oxidation annealing process can be performed in a wafer type apparatus using a resistance heater, and the high temperature crystallization process can be performed by dry O$_2$ annealing using a separate furnace type apparatus.

Using a separate furnace to perform the high temperature crystallization process may take thirty minutes to an hour. Moreover, if the time needed for increasing and lowering the temperature before and after crystallizing the Ta$_2$O$_5$ layer is added, it may take over four hours to perform the high temperature crystallization processing. Thus, the thermal budget may be increased while reducing wafer throughput. The complexity of the fabrication process may also be increased.

SUMMARY OF THE INVENTION

Embodiments according to the present invention can provide methods for forming capacitors including Ta$_2$O$_5$ dielectric layers including changing a wafer to heater separation or process chamber pressure. Pursuant to these embodiments, a Ta$_2$O$_5$ layer can be maintained at a first temperature that is less than a temperature for crystallization of the Ta$_2$O$_5$ layer. At least one of a position of the Ta$_2$O$_5$ layer in the process chamber relative to the heater and a pressure in the process chamber is changed to increase the temperature of the Ta$_2$O$_5$ layer to about the temperature for crystallization.

In some embodiments according to the present invention, the Ta$_2$O$_5$ layer in the process chamber is in a first position in the process chamber that is separated from the heater by a first distance. The Ta$_2$O$_5$ layer is moved from the first position to a second position in the process chamber that is separated from the heater by a second distance that is less than the first distance. In some embodiments according to the present invention, the first distance is about 2 mm and the second distance is less than about 1 mm.

In some embodiments according to the present invention, the $Ta_2O_5$ layer is in a first position in the process chamber that is separated from the heater by a first distance. The $Ta_2O_5$ layer is moved from the first position to a second position in the chamber that is separated from the heater by a second distance that is greater than the first distance. The $Ta_2O_5$ layer is moved from the second position to a third position in the chamber that is separated from the heater by a third distance that is less than the first distance.

In some embodiments according to the present invention, the heating further includes heating the $Ta_2O_5$ layer to a temperature that is less than about 650° C. in an $O_3$ or UV-$O_3$ atmosphere in the process chamber. In some embodiments, the changing further includes heating the $Ta_2O_5$ layer to a temperature that is greater than about 750° C. in an $O_2$, $N_2O$, $N_2$, Ar, or He atmosphere.

In some embodiments according to the present invention, the changing includes increasing the pressure in the process chamber to increase the temperature of the $Ta_2O_5$ layer to about the temperature for crystallization. In some embodiments according to the present invention, the first pressure is about 1.0 Torr and the second pressure is about 300 Torr.

In some embodiments according to the present invention, the $Ta_2O_5$ layer is in a first position in the process chamber that is separated from the heater by a first distance. The $Ta_2O_5$ layer is moved from the first position to a second position in the chamber that is separated from the heater by a second distance that is less than the first distance and the first pressure is increased to the second pressure in the process chamber.

In some embodiments according to the present invention, the heating further includes moving the $Ta_2O_5$ layer to a second position in the chamber that is separated from the heater by a first distance and moving the $Ta_2O_5$ layer away from the heater as the temperature at the first position is increased.

DETAILED DESCRIPTION OF EMBODIMENTS OF THE INVENTION

Figure 1:
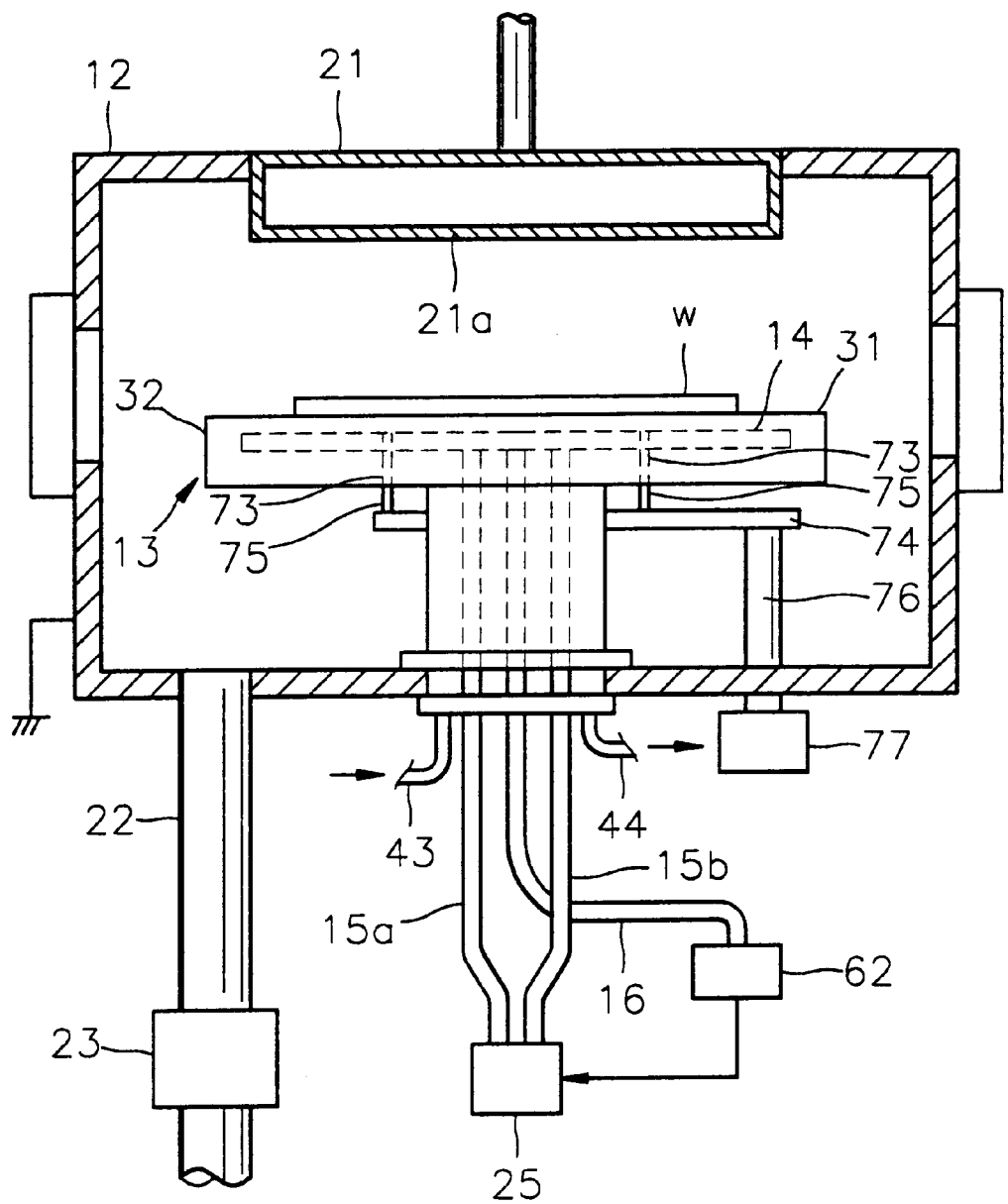
FIG. 1 is a vertical cross sectional view that schematically illustrates embodiments of a process chamber.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. Like numbers refer to like elements throughout.

FIG. 1 is a vertical cross sectional view schematically showing the configuration of a gas process apparatus which can be used in embodiments of methods of forming capacitors according to the present invention. As shown in FIG. 1, a CVD apparatus can be of the type available from Tokyo Electron, Limited located in Tokyo, Japan, which includes a shower head 21 on an upper portion of a process chamber 12 which can supply a process gas to the process chamber 12. The shower head 21 includes a plurality of holes 21a on a lower surface thereof opposite an integrated circuit wafer W to be processed, and can provide a process gas in a parallel down-flow.

An exhaust pipe 22 is connected to a bottom portion of the process chamber 12. The inside of the process chamber 12 can be maintained at a predetermined degree of vacuum by a vacuum pump 23 that is inline with the exhaust pipe 22.

A case 13 is provided at the bottom of the process chamber 12 opposite the shower head 21. The case 13 includes an upper cylindrical portion 32 having a stage 31 on which the wafer W is mounted. A heater 14, such as a resistive type heater, is located under the stage 31 in the upper cylindrical portion 32 of the case 13. Two electrical feed lines 15a and 15b are connected to the heater 14 and to a power source 25 outside the process chamber 12. The temperature of the heater 14 can be measured by a thermocouple 16 that is connected to the heater 14 and to a temperature controller 62 located outside the process chamber 12.

A supply pipe 43 can supply an inert gas to the inside of the case 13. An exhaust pipe 44 can be used to remove the inert gas from the inside of the case 13. An upper cylindrical portion 32 of the case 13, includes holes 73 which pass from the upper surface to the lower surface of the upper cylindrical portion 32. Three pins 75 (only two pins are shown in FIG. 1) are fixed to a ring-shaped lift plate 74. The pins 75 move through holes 73 so to protrude from the hole 73 in a first position and retract into the holes 73 in a second position relative to the mounting surface of the stage 31. The lift plate 74 is connected to a shaft 76 of a driving member 77 that can move up and down.

In some embodiments of methods according to the present invention, a $Ta_2O_5$ layer can be formed by performing a low temperature oxidation process to cure the $Ta_2O_5$ layer by providing supplementary oxygen to the process chamber 12 and a high temperature heating process to crystallize the $Ta_2O_5$ layer using the same wafer type apparatus as illustrated, for example, by FIG. 1 The low temperature oxidation process is performed at a temperature that is lower than the crystallization temperature of the $Ta_2O_5$ layer. The high temperature heating process is performed in the presence of a gas, other than $O_3$, while the temperature of the wafer is increased.

As realized by the present inventors, in general, the temperature at positions in the chamber 12 is related to a separation distance between the heater 14 and the positions in the chamber 12. In particular, the temperatures measured at positions in the chamber 12 that are separated by a large distance from the heater 14 are less than the temperatures at other positions that are separated from the heater 14 by a smaller distance. For example, in some embodiments according to the present invention, the heater 14 can maintain a first temperature in the chamber 12 at a first position that is separated from the heater 14 by a small distance. Accordingly, the temperature at a second position that is separated from the heater 14 by a distance that is greater than the small distance can be less than the first temperature.

In embodiments according to the present invention, the temperature of the wafer can be changed by changing the separation distance between the heater 14 and the wafer or the stage 31. Moreover, a substantial change in the heater 14 output may not be needed to change the wafer temperature. The wafer can be placed in a first position that is separated from the heater 14 by a first distance to maintain the wafer at a first temperature. The wafer can be moved towards the heater 14 to a second position that is separated from the heater 14 by a second distance that is less than the first distance to increase the temperature of the wafer.

According to FIG. 1, the separation distance between the heater 14 and the wafer can be adjusted by changing the positions of the pins 75. For example, the separation distance can be increased by further protruding the pins from the holes 73. The separation distance can be decreased by retracting the pins 75 further into the holes 73. In some embodiments according to the present invention, the wafer position is adjusted by changing the height of the pins 75. In other embodiments, the wafers can be mounted in other orientations in the chamber 12 so that the pins 75 move in other directions to adjust the separation between the heater 14 and the wafer. It will be understood that when the pins 75 are described herein as moving the wafer relative to the heater, it will be understood that the wafer may actually be moved relative to the heater 14 by other intervening objects that operate in cooperation with the pins.

Figure 2:
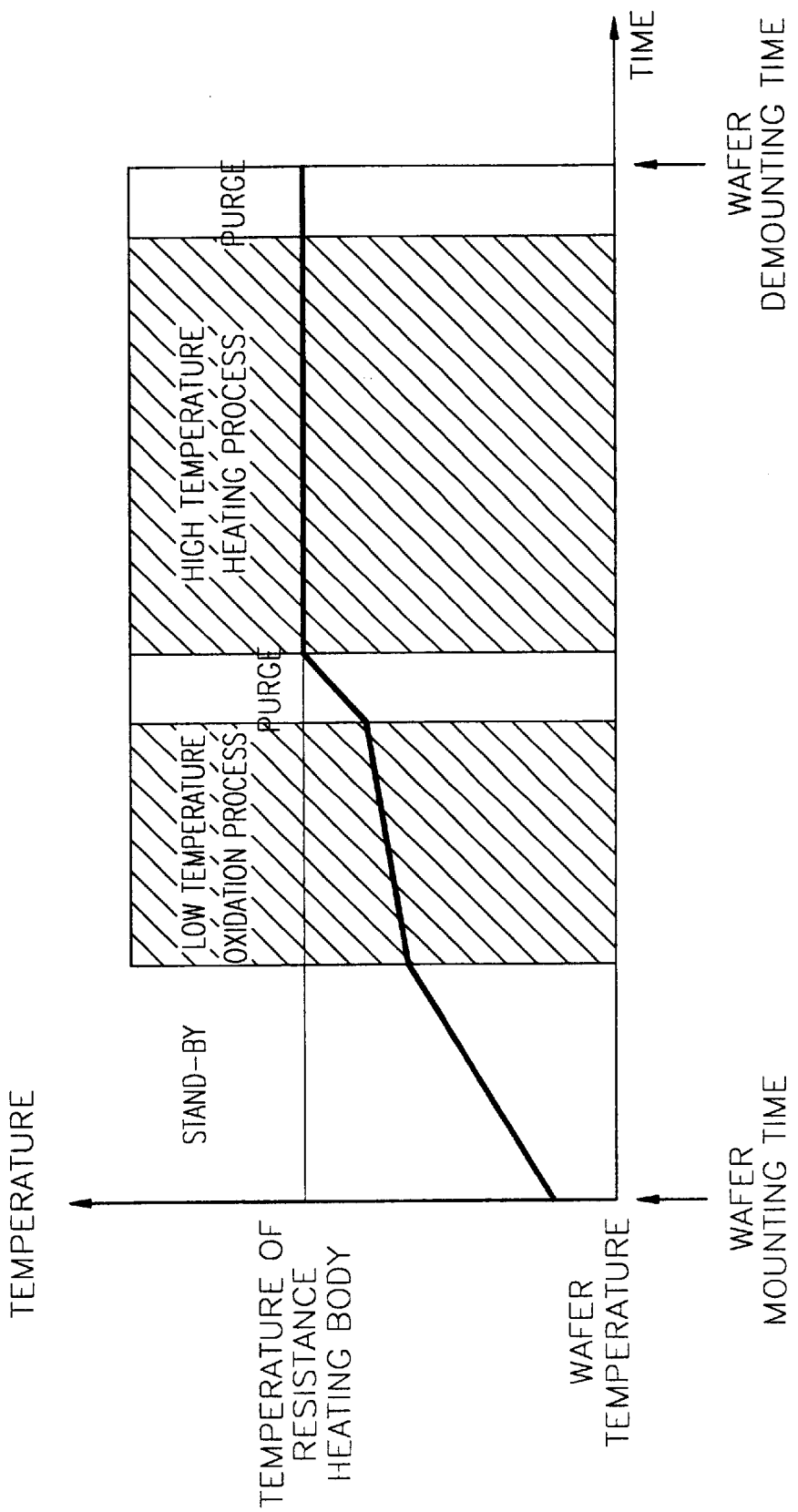
FIG. 2 is a graph that illustrates changes in wafer temperature using a resistance type heater according to the present invention.

FIG. 2 is a graph that illustrates changes in wafer temperature using a resistance type heater according to the present invention. According to some embodiments of the present invention, the temperature of the heater 14 is maintained at temperature at which the crystallization of the $Ta_2O_5$ layer can occur, for example, at 750° C., while the wafer temperature is maintained at a temperature that is lower than the crystallization temperature of the $Ta_2O_5$ layer so that the low temperature oxidation process can be performed. After the low temperature oxidation process is carried out, the wafer temperature is increased to the crystallization temperature so that the high temperature heating process can be performed.

Still referring to FIG. 2, the temperature of the wafer can be increased while the low temperature oxidation process is be performed to further reduce the increase in the wafer temperature that may be needed to carry out the high temperature heating process. The temperature of the wafer can be increased during the low temperature oxidation process by moving the wafer towards the heater 14.

The wafer can also be moved away from the heater 14 to prevent the temperature of the wafer from becoming too hot during the low temperature oxidation process. For example, as shown in FIG. 2, the wafer may be located close to the heater 14 at the beginning of the low temperature oxidation process. As the temperature of the atmosphere inside the chamber increases towards the crystallization temperature, the wafer may be moved away from the heater 14 to prevent the temperature of the wafer from reaching the crystallization temperature before the low temperature oxidation process in complete.

As shown in FIG. 2, the slope of the line indicating the temperature of the wafer is reduced once the low temperature oxidation process begins to maintain the temperature of the wafer below the crystallization temperature and to provide adequate time for the low temperature oxidation process to be carried out. When the low temperature oxidation process is complete, the wafer can be moved towards the heater 14 to increase the temperature of the wafer so that the temperature of the wafer can be increased to about the crystallization temperature so that the high temperature heating process can be performed. The separation distance between the heater 14 and the wafer can be adjusted during the high temperature heating process to maintain the temperature of the wafer at a substantially constant level.

Figure 3:
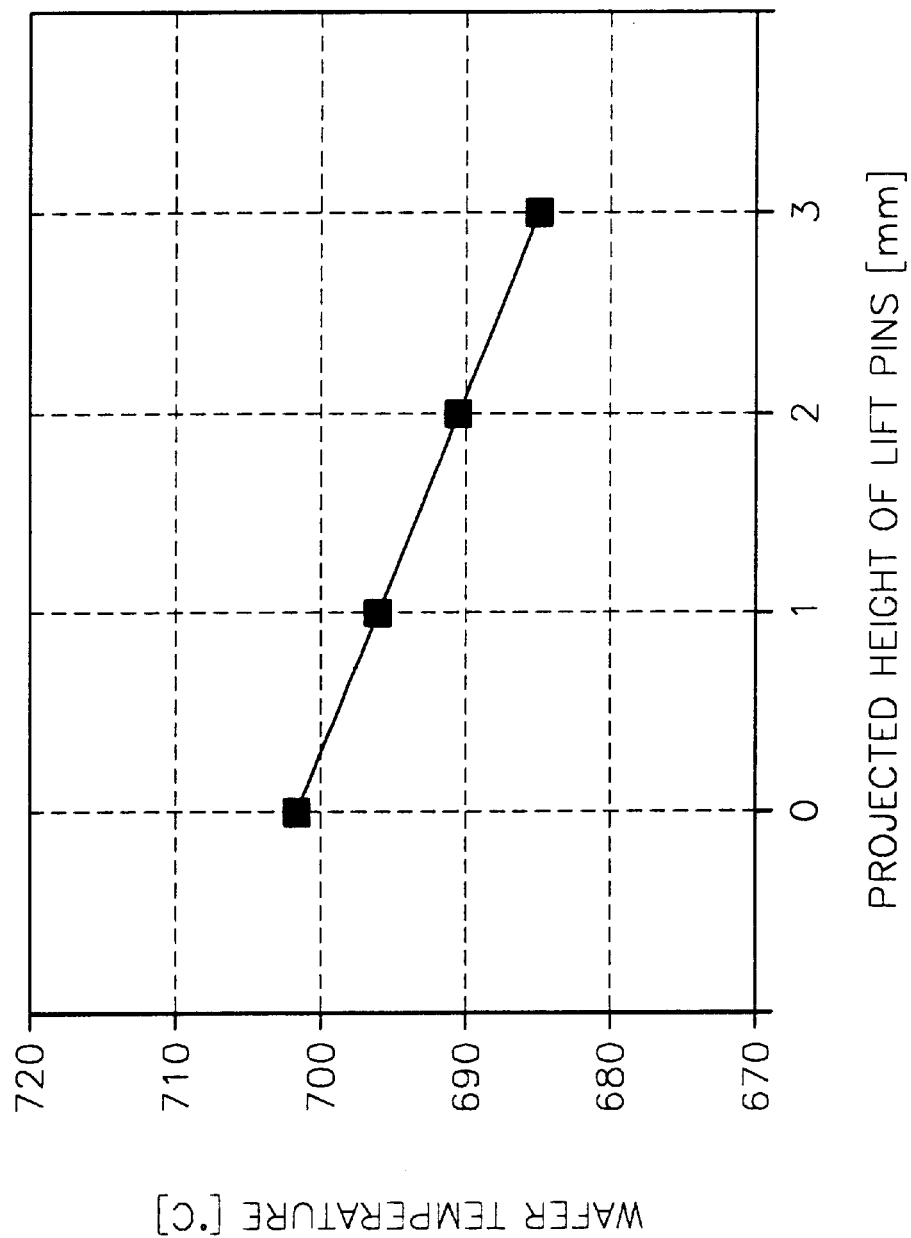
FIG. 3 is a graph that illustrates wafer temperature as a function of separation distance between the wafer and the resistance type heater according to the present invention.

FIG. 3 is a graph that illustrates changes in temperature of the wafer with respect to the distance which the pins 75 protrude from the holes 73 to provide the separation distance between the heater 14 and the wafer. In order to obtain the results shown in FIG. 3, the inside of the process chamber 12 was maintained at a vacuum of 1 mTorr, the temperature of the heater 14 was maintained at 750° C., and the wafer was supported by the pins 75 so that the pins 75 protruded from the holes to separate the wafer from the stage 31 by the following distances: 0.0 mm, 1 mm, 2 mm, and 3 mm. The wafer temperature was measured with the wafer at each of the separation distances. As shown in FIG. 3, each increase in the separation of 1 mm resulted in a decrease of about 5° C. in the temperature of the wafer.

Figure 4:
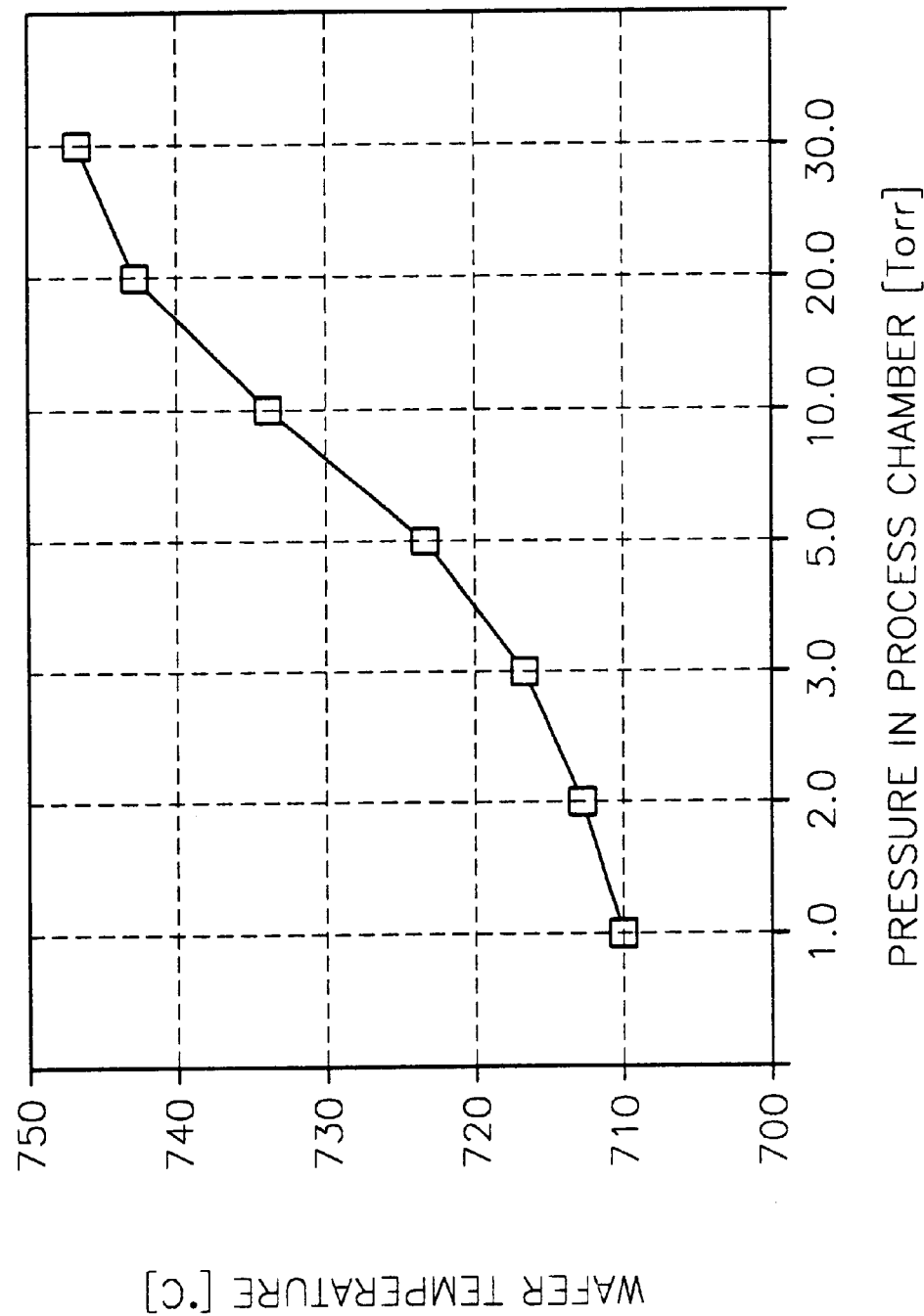
FIG. 4 is a graph that illustrates wafer temperature as a function of pressure in a process chamber that contains the wafer according to the present invention.

In some embodiments according to the present invention, the temperature of the wafer can be changed by increasing or decreasing the pressure in the chamber 12. As illustrated by FIG. 4, the temperature of the wafer can be increased by increasing the pressure in the chamber 12. Furthermore, the temperature of the wafer can be reduced by decreasing the pressure in the chamber 12. In order to obtain the results shown in FIG. 4, initially the pressure in the process chamber 12 was at 1.0 Torr, the temperature of the heater 14 was maintained at 750° C., and the wafer was in contact with the stage 31. The pressure in the process chamber 12 was changed from 1.0 Torr to 30.0 Torr. As shown by FIG. 4, as the pressure in the process chamber 12 increased, the temperature also increased. Furthermore, as the pressure in the process chamber 12 is decreased so may the temperature of the wafer.

As illustrated by FIGS. 3 and 4, the wafer temperature can be controlled by adjusting the position of the wafer in the chamber 12 and by adjusting the pressure in the process chamber 12. In some embodiments, the temperature of the wafer is controlled by a combination of changes in the wafer position relative to the heater 12 and changes in the chamber pressure.

Figure 5A:
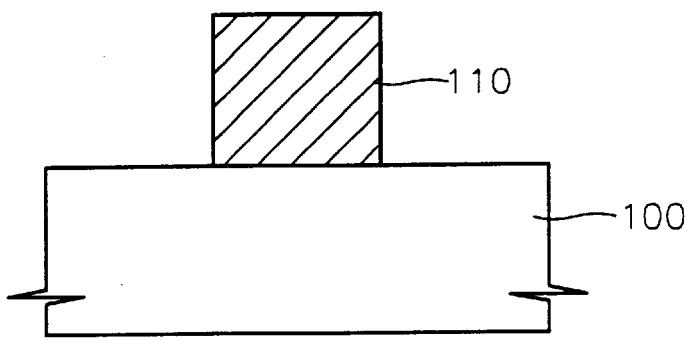
FIGS. 5A through 5F are cross sectional views that illustrate embodiments of methods of forming capacitors according to the present invention.
Figure 5B:
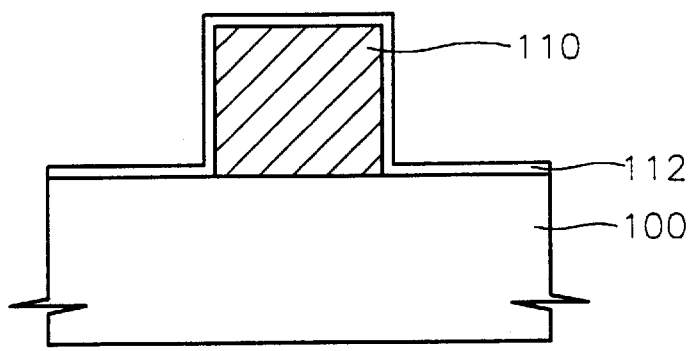

Referring to FIGS. 5A and 5B, a lower electrode 110 made of a material such as doped polysilicon is formed on a semiconductor substrate 100. A silicon nitride layer 112 is formed by nitriding an exposed Si surface on the semiconductor substrate 100 to a thickness of about 15 to 20 Å using a rapid thermal nitridation (RTN) process.

Figure 5C:
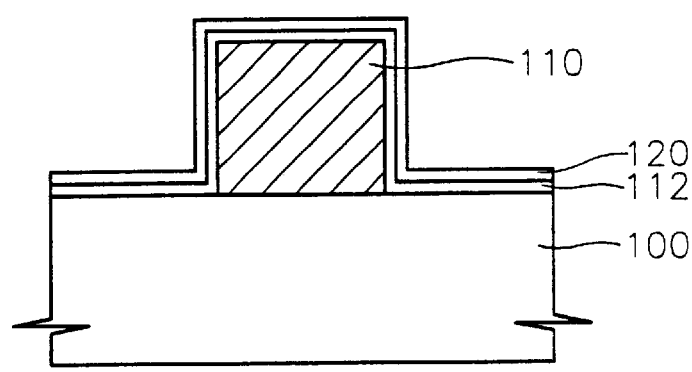
Figure 5D:
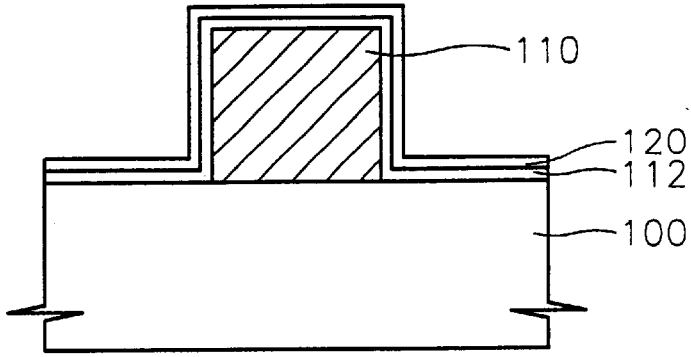
Figure 5E:
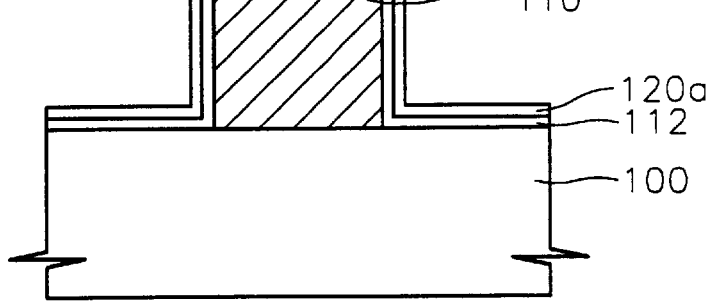

FIGS. 5C through 5E are cross sectional views that illustrate forming a $Ta_2O_5$ dielectric layer 120a. A $Ta_2O_5$ layer 120 is formed on the silicon nitride layer 112. The $Ta_2O_5$ layer 120 is annealed at a temperature lower than the crystallization temperature of $Ta_2O_5$ by a low temperature oxidation process in an ozone atmosphere 124 provided, for example, by $O_3$ or UV-$O_3$. The $Ta_2O_5$ layer 120 is cured by supplementing a deficiency of oxygen in the $Ta_2O_5$ layer 120. The low temperature oxidation process is performed in a process chamber which uses a heater as the heating means. For this process, the apparatus shown in FIG. 1 can be used.

Figure 6A:
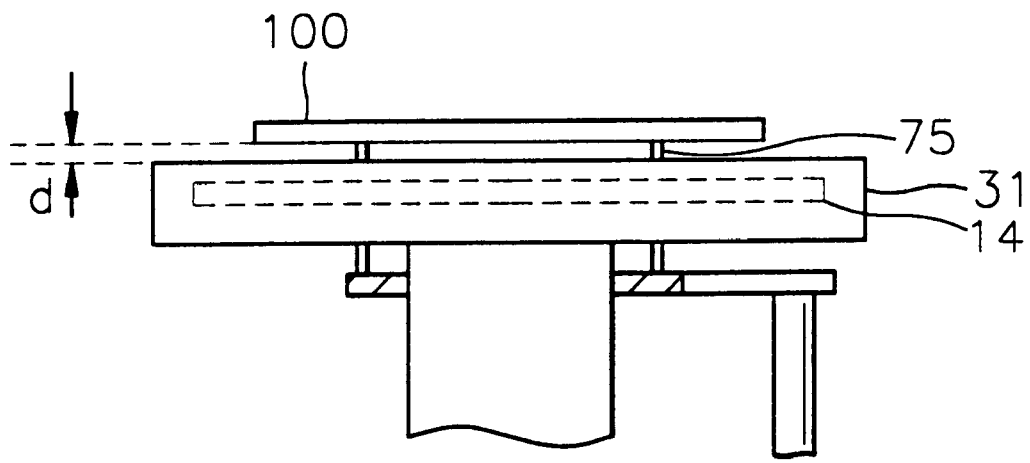
FIGS. 6A through 6B are cross sectional diagrams that illustrate embodiments of a process chamber that provides first and second separation distances between the wafer and a stage according to the present invention.

The temperature of the heater 14 is increased to a first temperature that is higher than the crystallization temperature of $Ta_2O_5$, for example, to 750° C., and maintained at about that temperature. As shown in FIG. 6A, the pins 75 are moved so as to protrude a predetermined distance d, such as about 2 mm, from the stage 31 so that the semiconductor substrate 100 is supported on the pins 75 and is separated from the stage 31 in a first position.

The separation of the wafer and the stage 31 by the distance d allows the temperature of the semiconductor substrate 100 to be maintained at a second temperature that is lower than the first temperature. For example, a separation distance of about 2 mm may allow the wafer to be maintained at about 650° C.

The temperature of the semiconductor substrate 100 can be adjusted by changing the distance which the pins 75 protrude from the stage 31. The low temperature oxidation process is performed by supplying $O_3$ to the inside of the process chamber 12 during or after the temperature of the semiconductor substrate 100 is stabilized when in the first position.

In some embodiments according to the present invention, the pressure in the process chamber 12 is preferably maintained at a pressure that is lower than 300 Torr. The low temperature oxidation annealing process is performed for 30 seconds to 5 minutes, and preferably for 2 minutes.

Figure 6B:
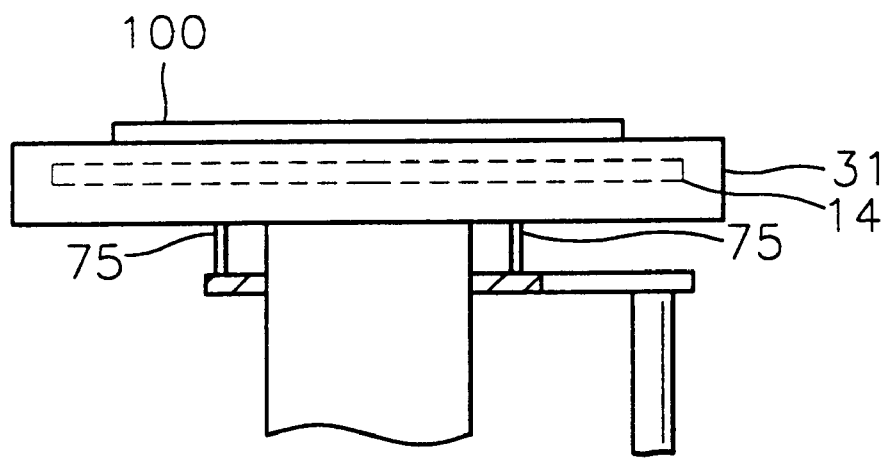

When the low temperature oxidation process is complete, the pins 75 are retracted to the position shown in FIG. 6B to reduce the separation distance between the stage 31 and the semiconductor substrate 100 so that the temperature of the semiconductor substrate 100 is increased to a temperature that is greater than or equal to the crystallization temperature of $Ta_2O_5$. In some embodiments according to the present invention, the semiconductor substrate 100 and the stage 31 are brought into contact with each other by retracting the pins 75 as shown in FIG. 6B. It will be understood that the pressure in the chamber 12 can be lower during the low temperature oxidation annealing process than the pressure in chamber 12 during the high temperature heating process.

While or after the temperature of the semiconductor substrate 100 is increased to the crystallization temperature of $Ta_2O_5$, the high temperature heating process is performed by supplying an atmospheric gas 126 of, for example, $O_2$, $N_2O$, $N_2$, Ar, He etc., to the semiconductor substrate 100. The high temperature heating process is performed for about 30 seconds to 5 minutes, and preferably for about 2 minutes. Preferably, the pressure in the process chamber 12 is kept under 300 Torr during the high temperature heating process.

According to the present invention, the dielectric layer 120a can be formed by increasing the temperature of the $Ta_2O_5$ layer 120 to a temperature that is higher than or equal to the crystallization temperature of the $Ta_2O_5$ layer to crystallize the $Ta_2O_5$ layer 120 using the same wafer machine used for the low temperature oxidation process. It will be understood that the processes illustrated by FIGS. 5A through 5F can be performed in the process chamber 12.

Figure 7:
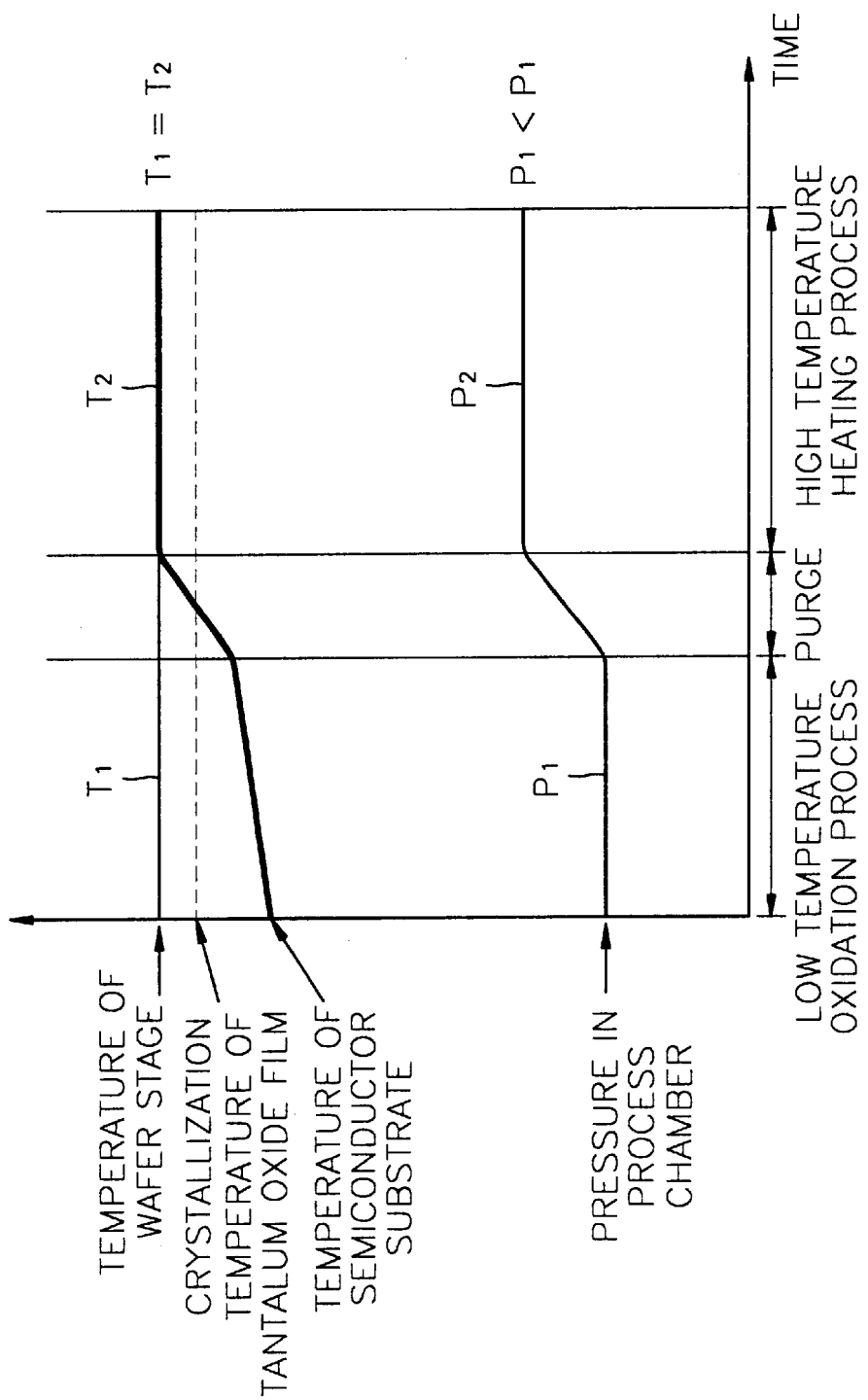
FIG. 7 is a diagram that illustrates temperature profiles of wafers including $Ta_2O_5$ layers as a function of pressure in a chamber that includes the wafers according to the present invention.

Referring to FIG. 7, in some embodiments according to the present invention, the low temperature oxidation process is performed when the semiconductor substrate 100 and the stage 31 are in contact with one another. As shown in FIG. 7, the temperature of the stage is maintained at a temperature that is greater than or equal to the crystallization temperature of $Ta_2O_5$. The pressure in the process chamber 12 is maintained at a first pressure $P_1$ that is less than 3 Torr, and preferably less than 2 Torr so that the temperature of the semiconductor substrate 100 is less than the crystallization temperature. An ozone atmosphere 124 is maintained in the chamber. The low temperature oxidation process can be performed as disclosed above in reference to FIG. 5E.

Figure 5F:
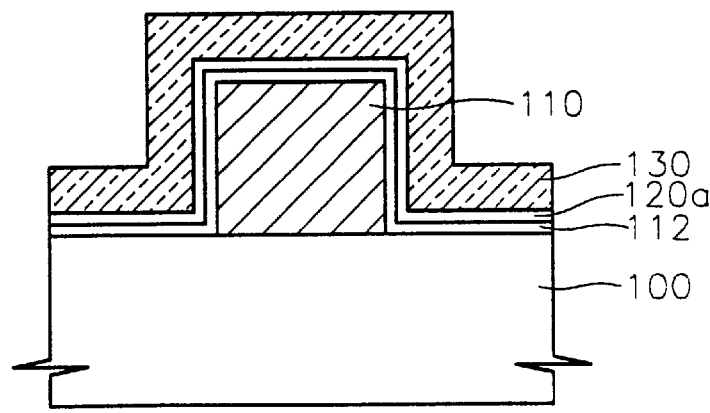

During the high temperature heating process, the pressure in the chamber 12 is increased to a second pressure $P_2$ that is greater than the first pressure $P_1$. Preferably, the second pressure $P_2$ is in a range of about 5 Torr to about 300 Torr. Accordingly, although the semiconductor substrate 100 contacts the stage 31 during the low temperature oxidation process, the semiconductor substrate 100 can be maintained at a temperature that is less than the crystallization temperature of $Ta_2O_5$ by the low pressure, i.e., the first pressure $P_1$. After the $Ta_2O_5$ dielectric layer 120a is crystallized, an upper electrode 130 can be formed on the $Ta_2O_5$ dielectric layer 120 as shown in FIG. 5F.

Figure 8:
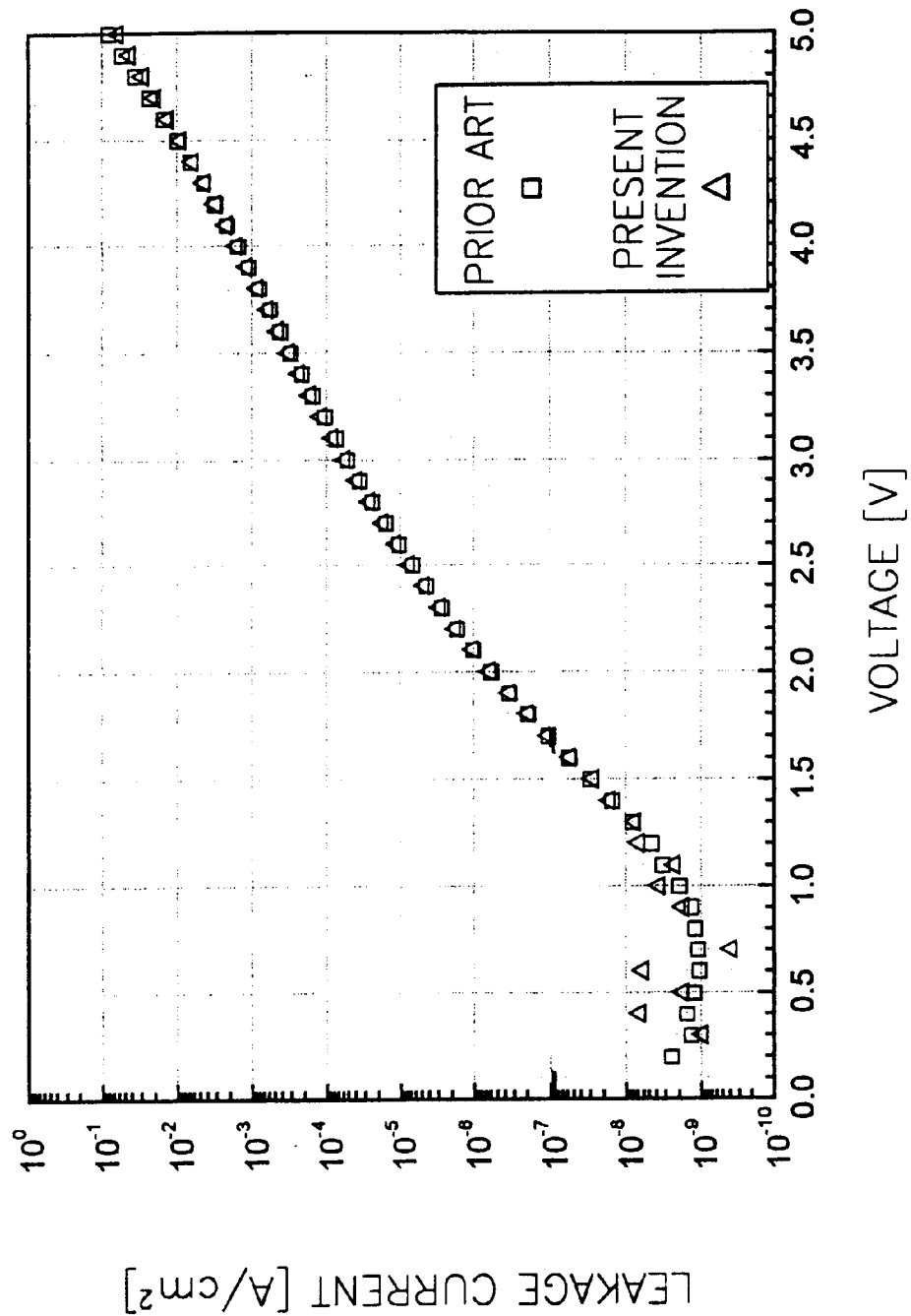
FIG. 8 is a graph that illustrates electrical characteristics of embodiments of capacitors according to the present invention.

FIG. 8 is a graph that illustrates data generated by embodiments according to the present invention as compared to conventional processes. In particular, the data corresponding to the conventional processes, designated by the (□) symbols, was generated by performing the high temperature heating process with dry $O_2$ annealing in a separate furnace. The data generated according to the present invention is designated by the (Δ) symbols.

Referring to FIG. 8, in the case of embodiments according to the present invention (Δ), the temperature of the heater is maintained at 750° C., and the $Ta_2O_5$ layer is cured by a low temperature oxidation process by UV-$O_3$ annealing for 2 minutes where the wafer that includes the $Ta_2O_5$ layer is separated from the stage by about 2 mm by causing the pins 75 to protrude from the stage. Then the $Ta_2O_5$ layer is crystallized by high temperature heating for 2 minutes using $O_2$ as an atmospheric gas in a state where the wafer and the stage contact each other by retracting the pins 75.

As shown in FIG. 8, the leakage currents in capacitors formed according to the present invention are about equal to leakage currents of capacitors formed using conventional processes.

In embodiments of methods of forming capacitors according to the present invention, a low temperature oxidation process is performed by separating a wafer including a $Ta_2O_5$ layer from the heater to maintain the temperature of the wafer below the crystallization temperature of the $Ta_2O_5$ layer. A high temperature heating process is performed to crystallize the $Ta_2O_5$ layer in situ with the low temperature oxidation process by reducing the separation of the heater and the wafer by, for example, bringing the stage and the wafer into contact with each other by retracting the pins 75.

As described above, the wafer temperature can be changed by controlling the height of the pins or by controlling the pressure in the process chamber where the temperature of the heater is set to a temperature that is higher than or equal to the crystallization temperature of the $Ta_2O_5$ layer. Further, since the low temperature oxidation process and the following high temperature heating process of the $Ta_2O_5$ layer are performed in situ in the same process chamber, it may not be necessary to use a separate furnace-shaped apparatus such as those used in the prior art.

It will be understood that although the wafers have been described herein as being moved by pins, the wafers may be moved by other means. For example, in some embodiments, the case 32 may be moved relative to the heater 14.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A method of forming a $Ta_2O_5$ layer in a process chamber, comprising:

maintaining the $Ta_2O_5$ layer at a first temperature that is less than a temperature for crystallization of the $Ta_2O_5$ layer; and changing at least one of a position of the $Ta_2O_5$ layer in the process chamber relative to the heater and a pressure in the process chamber to increase the temperature of the $Ta_2O_5$ layer to about the temperature for crystallization.

2. A method according to claim 1 wherein the position of the $Ta_2O_5$ layer in the process chamber comprises a first position of the $Ta_2O_5$ layer in the process chamber that is separated from the heater by a first distance to maintain the $Ta_2O_5$ layer at the first temperature, wherein the changing comprises moving the $Ta_2O_5$ layer from the first position to a second position in the process chamber that is separated from the heater by a second distance that is less than the first distance to increase the temperature of the $Ta_2O_5$ layer to about the temperature for crystallization.

3. A method according to claim 2, wherein the first distance comprises about 2 mm, and wherein the second distance comprises less than about 1 mm.

4. A method according to claim 1 wherein the position of the $Ta_2O_5$ layer in the process chamber comprises a first position of the $Ta_2O_5$ layer in the process chamber that is separated from the heater by a first distance, wherein the changing comprises:

moving the $Ta_2O_5$ layer from the first position to a second position in the chamber that is separated from the heater by a second distance that is greater than the first distance; and moving the $Ta_2O_5$ layer from the second position to a third position in the chamber that is separated from the heater by a third distance that is less than the first distance.

5. A method according to claim 1 wherein the heating further comprises heating the $Ta_2O_5$ layer to a temperature that is less than about 650° C. in an $O_3$ or $UV-O_3$ atmosphere in the process chamber.

6. A method according to claim 1 wherein the changing further comprises heating the $Ta_2O_5$ layer to a temperature that is greater than about 750° C. in an $O_2$, $N_2O$, $N_2$, Ar, or He atmosphere.

7. A method according to claim 1 wherein the changing comprises increasing the pressure in the process chamber to increase the temperature of the $Ta_2O_5$ layer to about the temperature for crystallization.

8. A method according to claim 7 wherein the first pressure comprises about 1.0 Torr, and wherein the second pressure comprises about 300 Torr.

9. A method according to claim 1 wherein the position of the $Ta_2O_5$ layer in the process chamber comprises a first position of the $Ta_2O_5$ layer in the process chamber that is separated from the heater by a first distance, wherein the changing comprises moving the $Ta_2O_5$ layer from the first position to a second position in the chamber that is separated from the heater by a second distance that is less than the first distance, and wherein the changing further comprises increasing the pressure in the process chamber to increase the temperature of the $Ta_2O_5$ layer to about the temperature for crystallization.

10. A method according to claim 1 wherein the heating further comprises:

moving the $Ta_2O_5$ layer to a second position in the chamber that is separated from the heater by a first distance; and moving the $Ta_2O_5$ layer away from the heater as the temperature at the first position increases.

* * * * *